(12) United States Patent
Chanchani et al.

(10) Patent No.: US 8,597,985 B1
(45) Date of Patent: Dec. 3, 2013

(54) MEMS PACKAGING WITH ETCHING AND THINNING OF LID WAFER TO FORM LIDS AND EXPOSE DEVICE WAFER BOND PADS

(75) Inventors: Rajen Chanchani, Albuquerque, NM (US); Christopher Nordquist, Albuquerque, NM (US); Roy H. Olsson, Albuquerque, NM (US); Tracy C. Peterson, Albuquerque, NM (US); Randy J. Shul, Albuquerque, NM (US); Catalina Ahlers, Albuquerque, NM (US); Thomas A. Plut, Albuquerque, NM (US); Gary A. Patrizi, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 13/364,166

(22) Filed: Feb. 1, 2012

(51) Int. Cl.
 *H01L 21/00* (2006.01)
(52) U.S. Cl.
 USPC .................................................. 438/110
(58) Field of Classification Search
 USPC .................................................. 438/110
 See application file for complete search history.

(56) References Cited

U.S. PATENT DOCUMENTS

| | | | | |
|---|---|---|---|---|
| 6,140,144 | A * | 10/2000 | Najafi et al. | 438/53 |
| 7,851,925 | B2 * | 12/2010 | Theuss et al. | 257/774 |
| 7,901,973 | B2 * | 3/2011 | Yamamoto | 438/65 |
| 2003/0183920 | A1 * | 10/2003 | Goodrich et al. | 257/701 |
| 2006/0088980 | A1 * | 4/2006 | Chen et al. | 438/460 |
| 2007/0045820 | A1 * | 3/2007 | Rybnicek | 257/704 |
| 2008/0217709 | A1 * | 9/2008 | Minervini et al. | 257/416 |
| 2009/0068795 | A1 * | 3/2009 | Higashi | 438/121 |
| 2009/0140413 | A1 * | 6/2009 | Wang et al. | 257/698 |
| 2009/0273047 | A1 * | 11/2009 | Yamamoto | 257/432 |
| 2010/0244161 | A1 * | 9/2010 | Tabrizi | 257/415 |
| 2011/0241197 | A1 * | 10/2011 | Theuss | 257/693 |
| 2012/0112335 | A1 * | 5/2012 | Ebefors et al. | 257/684 |
| 2012/0322206 | A1 * | 12/2012 | Tabrizi | 438/108 |
| 2013/0050228 | A1 * | 2/2013 | Petersen et al. | 345/501 |

OTHER PUBLICATIONS

Choa, Sung-Hoon, "Reliability study of hermetic wafer level MEMS packaging with through-wafer interconnect," Microsystem Technologies (2009) 15, pp. 677-686.

Premchandran, C. S. et al, "Design, fabrication, and testing of wafer level vacuum package for MEMS device," Proceedings of 56th Electronic Components and Technology Conference, San Diego, CA, May 2006, pp. 1136-1140.

Chae, Junseok, Giachino, Joseph M., and Najafi, Khalil, "Fabrication and characterization of a wafer-level MEMS Vacuum package with vertical feedthroughs," Journal of Microelectromechanical Systems, 17, No. 1 Feb. 2008, pp. 193-200.

Monajemi, Pejman et al, "Wafer-level MEMS packaging via thermally released metalorganic memberanes," Journal of Micromechanical Microengineering, 16, (2006), pp. 742-750.

* cited by examiner

*Primary Examiner* — Yu-Hsi D Sun
*Assistant Examiner* — Grant Withers
(74) *Attorney, Agent, or Firm* — Martin I. Finston

(57) ABSTRACT

In wafer-level packaging of microelectromechanical (MEMS) devices a lid wafer is bonded to a MEMS wafer in a predetermined aligned relationship. Portions of the lid wafer are removed to separate the lid wafer into lid portions that respectively correspond in alignment with MEMS devices on the MEMS wafer, and to expose areas of the MEMS wafer that respectively contain sets of bond pads respectively coupled to the MEMS devices.

16 Claims, 2 Drawing Sheets

MEMS PACKAGING WITH ETCHING AND THINNING OF LID WAFER TO FORM LIDS AND EXPOSE DEVICE WAFER BOND PADS

This invention was developed under Contract DE-AC04-94AL85000 between Sandia Corporation and the U.S. Department of Energy. The U.S. Government has certain rights in this invention.

FIELD

The present work relates generally to MEMS devices and, more particularly, to wafer-level packaging of MEMS devices.

BACKGROUND

Radio frequency microelectromechanical (RF MEMS) technology uses moving sub-millimeter-sized parts to provide RF functionality. RF MEMS components (e.g., resonators, oscillators, switches, switched capacitors, varactors, etc.) are known to provide performance improvements in miniature volumes. For example, the high-Q and miniature size of RF MEMS resonators provides the opportunity for substantial miniaturization of RF filters and frequency references. As another example, the low loss and low capacitance of RF MEMS switches offer improved adaptability and switching functions. The packaging and integration of RF MEMS components factor significantly in their future applications in, for example, radar, communications, and sensing systems.

The packaging of MEMS components presents a unique challenge because these devices require an empty volume to function, and the cleanliness and environmental integrity of that volume impacts the device performance and reliability. Thus, the empty volume around MEMS components must be a hermetic microenvironment. Widespread use of MEMS components depends on the ability to combine cost-effective packaging with high-yield production. Additionally, in order to maintain device performance and impedance matching, the signal traces that provide external access to the packaged microenvironment should have low resistance and capacitance. These packaging requirements eliminate discrete individual packaging approaches such as injection molding and assembly of individual MEMS die into lidded ceramic or plastic packages. Wafer-level packaging offers the advantages of miniaturized volumes, lower cost packaging and higher production yields.

There are various known wafer-level approaches for providing a hermetic MEMS microenvironment. One approach bonds a (silicon or glass) lid wafer to a MEMS (silicon) wafer, and provides vias through the MEMS wafer for I/O interconnects to the microenvironment. Another approach provides vias through the lid wafer as I/O interconnects. A further approach seals the microenvironment with a hermetic membrane fabricated by removing a sacrificial layer. These known approaches disadvantageously require relatively costly, low-yield semiconductor fabrication process steps.

It is desirable in view of the foregoing to provide for lower cost, higher yield MEMS packaging techniques.

DETAILED DESCRIPTION

The present work provides wafer-level packaging for MEMS in a hermetic microenvironment, using wafer level processes such as eutectic bonding, Bosch etching and mechanical lapping and thinning, which are more cost-effective than processes required to produce the aforementioned through-silicon vias and membrane lids of the prior art. Some embodiments provide a packaged MEMS device with dimensions of 1.3 mm×1.3 mm×200 µm thick. Various features described in detail below are not necessarily shown to scale in the appended drawings.

Metal stacks are provided on a lid wafer and a MEMS device wafer. The stacks on the lid wafer are configured to be aligned with and bonded to the stacks on the MEMS wafer to form seal rings respectively surrounding MEMS devices provided on the MEMS wafer. Some embodiments provide Ti/Pt/Au stacks on the MEMS wafer, and Ti/Pt/Au/Ge/Au stacks on the lid wafer. The MEMS wafer is also provided with I/O bond pads for each MEMS device. The bond pads surround the outer periphery of the seal ring stack of the associated MEMS device. The MEMS wafer is further provided with a set of I/O interconnections between each MEMS device and its associated set of bond pads. Each set of interconnections passes beneath the associated seal ring stack, and is insulated from the seal ring stack by an insulating layer (an AlN layer in some embodiments) interposed between the interconnections and the stack metallization.

Prior to bonding the MEMS and lid wafers, the lid wafer is Bosch-etched to a first depth in areas corresponding to the bond pad areas on the MEMS wafer, and to a second, shallower depth in areas corresponding to the device areas on the MEMS wafer. In some embodiments, the first and second depths are approximately 120 µm and 20 µm, respectively. The MEMS and lid wafers are then aligned, and their seal ring stacks are bonded (in vacuum or in a nitrogen environment in some embodiments) at or above the Au—Ge Eutectic temperature, 363° C. The bonded wafers are then mechanically thinned and polished. The MEMS-side of the bonded wafer assembly is thinned to about 100 µm (or less) in some embodiments, with a nearly scratch-free and crack-free surface. Thinning of the MEMS-side is an option to reduce the overall thickness of the MEMS/Lid assembly. Some embodiments omit the MEMS-side thinning. In some embodiments, the lid wafer is similarly thinned to about 100 µm (or less). This lid-side of the bonded wafer thinning process exposes the bond pads on the MEMS wafer, and produces lids of 100

μm (or less) thickness covering 20 μm deep device cavities (the hermetic microenvironments for the MEMS devices). The resulting MEMS wafer/lid wafer assembly is sawed to produce individually packaged MEMS devices (having a thickness of 200 μm or less) that may each be integrated into a larger assembly either by wire bonding to the bond pads, or by attaching solder balls to the bond pads for surface mounting.

Figure 1:
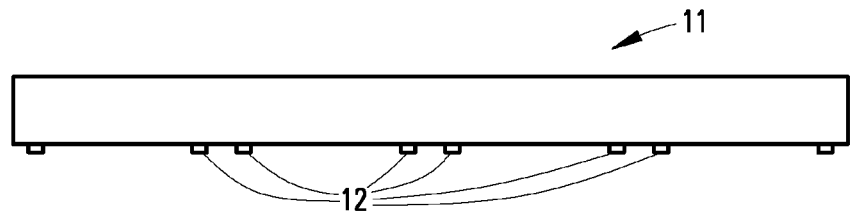
FIG. 1 is a diagrammatic illustration of a lid wafer in cross-section after seal ring deposition.
Figure 5:
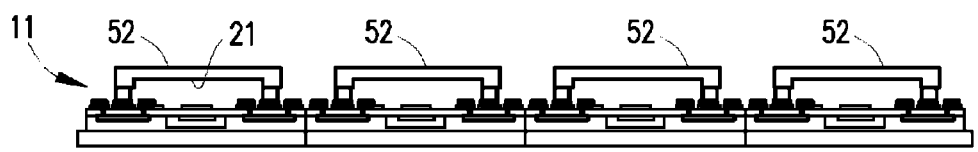
FIG. 5 diagrammatically illustrates a plurality of packaged MEMS devices that result from the wafer-level thinning process of FIG. 4.

FIG. 1 is a diagrammatic illustration of a lid wafer 11 in cross-section after seal ring deposition, as is known in the art. The lid wafer 11 may be any wafer suitable for use in conventional MEMS technology. In some embodiments, the lid wafer 11 (and the MEMS wafer, shown at 51 in FIG. 5) has a diameter of 150 mm and a thickness of 675 μm. In various embodiments, the metallizations on the lid wafer 11 (and on the MEMS wafer 51) include sputtered metal films or evaporated metal films. In some embodiments, all metallizations on the lid wafer 11 and the MEMS wafer 51 are patterned using conventional photoresist and metal lift-off techniques.

In some embodiments, a seal ring pattern at 12 on the lid wafer 11 of FIG. 1 is formed using lift-off photolithography with an evaporated metal stack of 20 nm Ti, 100 nm Pt, 440 nm Au, 500 nm Ge, and 100 nm Au. In some embodiments, the width of the seal ring metal at 12 is less than the width of the seal ring metal on the MEMS wafer 51, to provide an alignment tolerance to help ensure that the lid wafer seal rings 12 always make full contact with the corresponding MEMS wafer seal rings. For example, in some embodiments the lid wafer seal rings 12 are 40 μm wide and the MEMS wafer seal rings (see, e.g., 32 in FIG. 3) are 80 μm wide.

Figure 2:
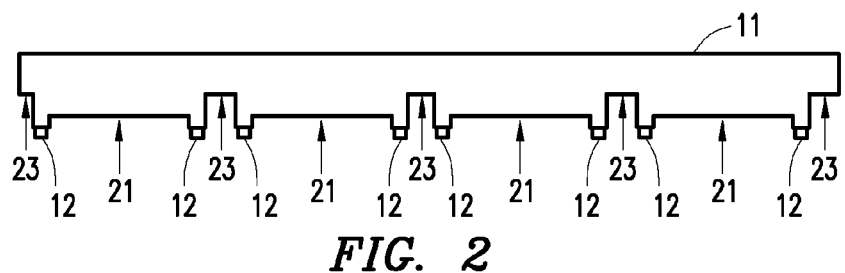
FIG. 2 illustrates the lid wafer of FIG. 1 after cavity formation according to example embodiments of the present work.

FIG. 2 illustrates in cross-section the lid wafer 11 of FIG. 1 after cavity formation according to example embodiments of the present work. As shown in FIG. 2, cavities of two different depths are formed in the lid wafer 11. Smaller depth (20 μm in some embodiments) cavities 21 are formed in the areas corresponding to the device areas on the MEMS wafer, and larger depth (120 μm in some embodiments) cavities 23 are formed in the areas corresponding to the bond pad areas that respectively surround the seal ring areas on the MEMS wafer 51. In some embodiments, the cavities 21 and 23 are formed by conventional Bosch etching, also known as Deep Reactive Ion Etching (DRIE). DRIE allows highly anisotropic, high-aspect ratio, deep etching of features in silicon wafers.

Some embodiments feature a two-step lithography process that uses a hard mask of cured photoresist and a soft mask of uncured photoresist as follows. With the seal ring metallization pattern 12 in place on the lid wafer 11 as shown in FIG. 1, 5 μm of photoresist (AZ-4330 in some embodiments) is deposited on the seal rings 12 of the lid wafer 11 to define device areas as well as bond pad areas. This photoresist is then hard baked at 180° C. to produce the hard mask. In a second lithography step, 3.5 μm of the photoresist is deposited to define on the lid wafer 11 only the bond pad areas, which correspond to the deeper cavity depths shown in FIG. 2. The lid wafer 11 is then exposed to an initial DRIE cycle to etch the bond pad area cavities 23 to a depth of about 100 μm. The soft mask is then stripped (using acetone in some embodiments), leaving only the hard mask in place. The lid wafer 11 is then exposed to a second DRIE cycle to etch the device area cavities 21 to a depth of about 20 μm. During this second etch cycle, the bond pad area cavities 23 are additionally further etched about 20 μm, to give them a total depth of approximately 120 μm. The hard mask is then removed (using an oxygen ash process in some embodiments). When the etching process is completed, the 20 μm deep device area cavities 21 and the 120 μm deep bond pad area cavities 23 are in place in the lid wafer 11, as shown in FIG. 2.

Figure 9:
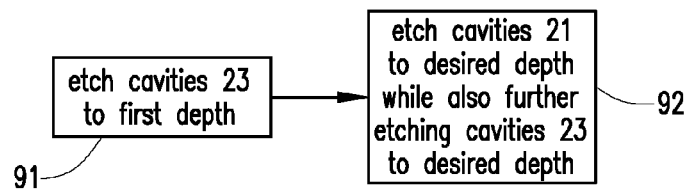
FIG. 9 illustrates operations of a two-cycle etch process according to example embodiments of the present work.

FIG. 9 illustrates operations of the above-described two-cycle etch process. A first etch cycle at 91 initially etches the cavities 23 to a first (e.g., 100 μm) depth, and a second etch cycle at 92 thereafter etches the cavities 21 to their desired depth (e.g., 20 μm) depth, while also further etching the cavities 23 to their desired (e.g., 120 μm) depth. As will become apparent hereinbelow, the etching of cavities 23 ultimately contributes both to exposing bond pads on the MEMS wafer 52, and to separating the lid wafer 11 into individual lids.

Figure 3:
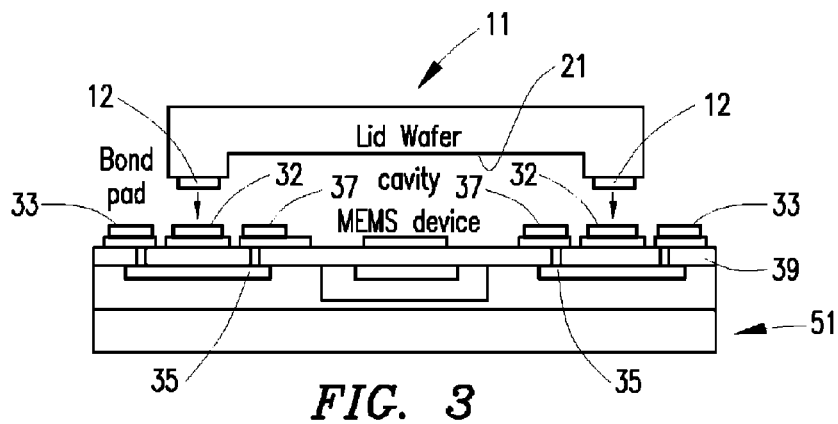
FIG. 3 diagrammatically illustrates in more detail a portion of a MEMS wafer according to example embodiments of the present work.

As shown most clearly in FIG. 3, the MEMS wafer 51 (part of which is shown in FIG. 3) has deposited thereon seal ring metallization stacks 32 arranged in the same pattern as the pattern of seal ring metallization stacks at 12 in FIG. 1. In addition, the MEMS wafer 51 has bond pads 33 deposited thereon in surrounding relationship to the respective seal ring stacks 32. The MEMS wafer 51 further includes a set of Signal/Power/Ground interconnections 35 between each MEMS device and its associated set of bond pads 33. The interconnections 35 of each set are respectively connected to a corresponding set of interconnect pad metallizations 37 located inwardly of the corresponding seal ring 32, around the periphery of the MEMS microenvironment provided by the cavity 21. The interconnections 35 pass underneath the associated seal ring 32, isolated from the seal ring metallization by an insulating AlN layer 39 interposed between the seal ring metallization and the interconnections 35. The interconnections 35 extend through the AlN layer 39 to connect to the bond pads 33 and the interconnect pads 37.

During fabrication of the MEMS wafer 51, some embodiments provide the interconnections 35 and insulating AlN layer 39 using conventional semiconductor fabrication techniques. The bond pad metallizations at 33, the seal ring metallizations at 32, and the interconnect metallizations 37 are deposited using conventional techniques in some embodiments. As previously mentioned, the seal rings 32 are 80 μm wide in some embodiments. In some embodiments, the bond pads 33 are 105 μm long (extending in the outward direction from the associated MEMS device), 75 μm wide coplanar transmission lines on 300 μm pitch, separated from the associated seal ring 32 by a gap of 40 μm. In some embodiments, the interconnect pads 37 are 100 μm square on 150 μm pitch. Some embodiments use a metal stack of 20 nm Ti, 100 nm Pt and 500 nm Au to form both the bond pads 33 and the interconnect pads 37.

After the seal rings 32 are patterned on the front side of the MEMS wafer 51, a backside image is created, using a conventional evaporated metal liftoff technique, to form the features necessary to align the seal rings 32 of the MEMS wafer 51 with the seal rings 12 of the lid wafer 11 for a wafer bonding operation. In some embodiments, the last process step performed on the MEMS waver 51 immediately prior to wafer alignment and bonding is a MEMS release step using XeF2 for removal of a polysilicon release layer. Creation of a backside image, and the MEMS release step are familiar operations in conventional MEMS technology. In some embodiments, before aligning and bonding, the MEMS and lid wafers are exposed to an oxygen plasma treatment to reduce surface moisture and other contaminants in conventional fashion.

Some embodiments use a conventional EVG-620 alignment system to align the MEMS and lid wafers for bonding. With the seal rings 12 and 32 of the wafers 11 and 51 properly aligned in an aligning fixture, the fixture is transferred to the bonding chamber of a conventional EVG520 bonder. The present work bonds the seal rings 12 of the lid wafer 11 to the aligned seal rings 32 of the MEMS wafer 51 using conventional eutectic bonding. Various embodiments use various types of eutectic bonding, examples of which include Au—Ge eutectic bonding, Au—Si eutectic bonding and Au—Sn eutectic bonding. In various embodiments, the seal ring bonding is performed at a temperature slightly higher than the Au—Ge eutectic temperature (363° C.) for five minutes either in vacuum (1E-4 mBar pressure), or in a nitrogen environment with a bonding force of 3 kN, which equates to 2.1 MPa pressure. After bonding, the temperature is ramped down to 200° C., after which the bonded wafer assembly is cooled to room temperature in ambient.

Figure 4:
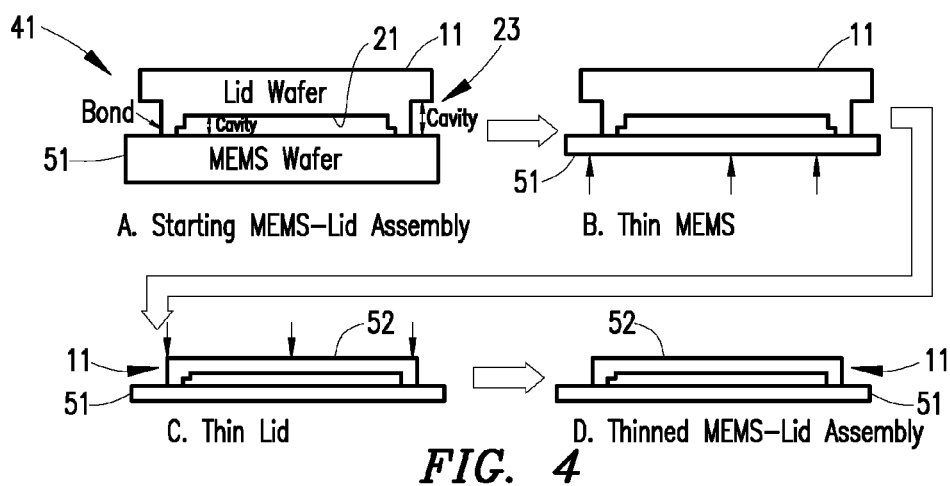
FIG. 4 diagrammatically illustrates a MEMS/Lid wafer thinning process according to example embodiments of the present work.

FIG. 4 diagrammatically illustrates wafer thinning applied to the bonded wafers 11 and 51 according to example embodiments of the present work. The thinning operations of FIG. 4 are shown for a portion 41 (corresponding to a single MEMS device) of the entire bonded wafer assembly. This portion 41 is shown at A. In the example of FIG. 4, the MEMS wafer 51 is first thinned to around 100 μm (or less in some embodiments), as shown at B. In some embodiments, the thinning at B follows a sequence of (1) very coarse grinding with 9 to 15 μm slurry to remove around 500 μm of silicon, (2) fine grinding with 3 μm slurry to remove around 35 μm of silicon, and (3) very fine grinding with 1 and 0.5 μm slurry to remove around 10 μm of silicon.

Figure 6:
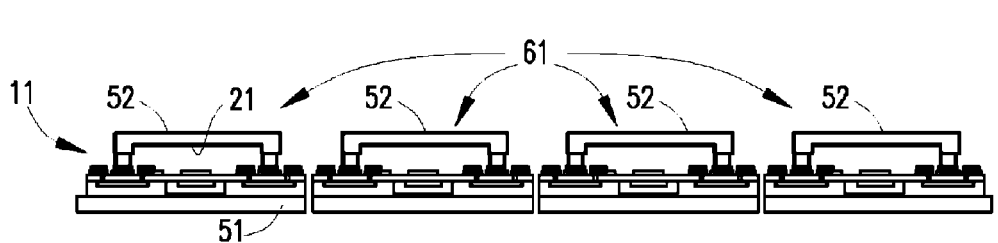
FIG. 6 shows the packaged MEMS devices of FIG. 5 after singulation.

Next, as shown at C in FIG. 4, the lid wafer 11 is thinned sufficiently to open the ends of the cavities 23 (see also FIG. 2) and thereby expose the bond pads 33 (see also FIG. 3) on the MEMS wafer 51. This thinning thus provides bond pad access for connection of the MEMS devices into a larger assembly. The opening of the ends of the cavities 23 also completes the process of separating the lid wafer 11 into individual lid portions 52 (see also FIGS. 5-8) that respectively cover the MEMS devices on the MEMS wafer 51. In some embodiments, the thinning at C follows a sequence of (1) fine grinding with 6 μm/3 μm slurries to remove around 450 to 500 μm of silicon, and (2) very fine grinding with 1 μm/0.5 μm slurries to remove around 50-100 μm of silicon. The resultant thinned wafer assembly, shown at D in FIG. 4 (also shown in FIGS. 3 and 5), may then be cleaned (e.g., with acetone and isopropanol), mounted on UV tape, and sawed to singulate the packaged MEMS devices. FIG. 6 illustrates the singulated MEMS device packages 61, which may be demounted and cleaned (e.g., in acetone and isopropanol).

Figure 7:
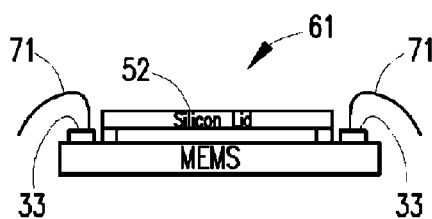
FIGS. 7 and 8 respectively illustrate wire bonding and surface mount bonding options provided by the packaged MEMS devices of FIG. 6.
Figure 8:
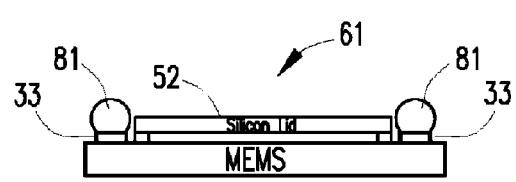

As shown in FIGS. 7 and 8, the bond pads 33 of each packaged MEMS device are accessible to support connection of the device into a larger assembly, by wire bonding 71 (FIG. 7) in some embodiments, and by solder balls 81 (FIG. 8) for surface mounting in some embodiments.

It will be appreciated that the example embodiments described above advantageously provide for packaging MEMS devices using relatively low cost wafer level processes such as eutectic bonding, Bosch etching and mechanical lapping and thinning. This in turn provides for lower costs and higher production yields than are typically available with the aforementioned prior art technologies that require through-silicon vias or hermetic membranes.

Although example embodiments of the present work are described above in detail, this does not limit the scope of the present work, which can be practiced in a variety of embodiments.

What is claimed is:

1. A wafer-level process for packaging microelectromechanical (MEMS) devices, comprising:
bonding a lid wafer to a MEMS wafer in a predetermined aligned relationship; and
removing portions of the lid wafer to separate the lid wafer into lid portions that respectively correspond in alignment with MEMS devices on the MEMS wafer, wherein said removing also exposes areas of the MEMS wafer that respectively contain sets of bond pads respectively coupled to the MEMS devices,
wherein said removing includes thinning the lid wafer after said bonding, and
wherein said removing includes, before said bonding and based on said predetermined aligned relationship, producing cavities in respective areas of the lid wafer that respectively correspond in alignment with said areas of the MEMS wafer, and wherein said thinning opens respective ends of the cavities.

2. The process of claim 1, wherein said producing includes etching the cavities in the lid wafer.

3. The process of claim 1, including, before said bonding, providing the lid portions in the lid wafer by, based on said predetermined aligned relationship, producing further cavities in respective further areas of the lid wafer that respectively correspond in alignment with further areas of the MEMS wafer that contain the MEMS devices.

4. A wafer-level process for packaging microelectromechanical (MEMS) devices, comprising:
bonding a lid wafer to a MEMS wafer in a predetermined aligned relationship; and
removing portions of the lid wafer after said bonding in an operation that concurrently thins the lid wafer and separates the lid wafer into discrete lid portions that respectively correspond in alignment with MEMS devices on the MEMS wafer, wherein said removing also exposes areas of the MEMS wafer that respectively contain sets of bond pads respectively coupled to the MEMS devices,
wherein said removing includes, before said bonding and based on said predetermined aligned relationship, producing cavities in respective areas of the lid wafer that respectively correspond in alignment with said areas of the MEMS wafer, and
wherein said producing includes etching the cavities in the lid wafer.

5. The process of claim 4, wherein said etching includes deep reactive ion etching.

6. A wafer-level process for packaging microelectromechanical (MEMS) devices, comprising:
bonding a lid wafer to a MEMS wafer in a predetermined aligned relationship; and
removing portions of the lid wafer to separate the lid wafer into lid portions that respectively correspond in alignment with MEMS devices on the MEMS wafer, wherein said removing also exposes areas of the MEMS wafer that respectively contain sets of bond pads respectively coupled to the MEMS devices,
wherein said removing includes, before said bonding and based on said predetermined aligned relationship, producing cavities in respective areas of the lid wafer that respectively correspond in alignment with said areas of the MEMS wafer,
the process including, before said bonding, providing the lid portions in the lid wafer by, based on said predetermined alignment relationship, producing further cavities in respective further areas of the lid wafer that respectively correspond in alignment with further areas of the MEMS wafer that contain the MEMS devices.

7. The process of claim 6, wherein said cavities are deeper than said further cavities.

8. The process of claim 7, wherein said producing said cavities and said producing said further cavities share an etching operation.

9. A wafer-level process for packaging microelectromechanical (MEMS) devices, comprising:
   bonding a lid wafer to a MEMS wafer in a predetermined aligned relationship; and
   removing portions of the lid wafer to separate the lid wafer into lid portions that respectively correspond in alignment with MEMS devices on the MEMS wafer, wherein said removing also exposes areas of the MEMS wafer that respectively contain sets of bond pads respectively coupled to the MEMS devices,
   wherein said bonding includes bonding first metal seal rings respectively provided on the lid portions to respective second metal seal rings that respectively surround the MEMS devices on the MEMS wafer and are respectively aligned with the first metal seal rings.

10. The process of claim 9, including providing each of the second metal seal rings between the associated MEMS device and the associated set of bond pads on the MEMS wafer, connecting each of the MEMS devices to the associated set of bond pads with a set of interconnections, and providing an insulating material between the set of interconnections and the associated second metal seal ring.

11. The process of claim 10, wherein said removing includes thinning the lid wafer after said bonding.

12. The process of claim 11, wherein said removing includes, before said bonding and based on said predetermined aligned relationship, producing cavities in respective areas of the lid wafer that respectively correspond in alignment with said areas of the MEMS wafer, and wherein said thinning opens respective ends of the cavities.

13. The process of claim 12, including, before said bonding, providing the lid portions in the lid wafer by, based on said predetermined aligned relationship, producing further cavities in respective further areas of the lid wafer that respectively correspond in alignment with further areas of the MEMS wafer that contain the MEMS devices.

14. The process of claim 10, wherein said removing includes, before said bonding and based on said predetermined aligned relationship, producing cavities in respective areas of the lid wafer that respectively correspond in alignment with said areas of the MEMS wafer.

15. The process of claim 14, including, before said bonding, providing the lid portions in the lid wafer by, based on said predetermined aligned relationship, producing further cavities in respective further areas of the lid wafer that respectively correspond in alignment with further areas of the MEMS wafer that contain the MEMS devices.

16. A wafer-level process for packaging microelectromechanical (MEMS) devices, comprising:
   bonding a lid wafer to a MEMS wafer in a predetermined aligned relationship; and
   based on said predetermined aligned relationship, separating the lid wafer into lid portions that respectively correspond in alignment with MEMS devices on the MEMS wafer, wherein said separating includes etching cavities in one side of the lid wafer and thinning the other side of the lid wafer until said etched cavities penetrate all the way through the thinned lid wafer.

* * * * *